(12) United States Patent
Kakui

(10) Patent No.: US 8,873,595 B2
(45) Date of Patent: Oct. 28, 2014

(54) LASER PROCESSING METHOD

(75) Inventor: Motoki Kakui, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/231,698

(22) Filed: Sep. 13, 2011

(65) Prior Publication Data

US 2012/0106581 A1 May 3, 2012

Related U.S. Application Data

(60) Provisional application No. 61/385,373, filed on Sep. 22, 2010.

(30) Foreign Application Priority Data

Sep. 15, 2010 (JP) ................ P2010-206871

(51) Int. Cl.
| | | |
|---|---|---|
| H01S 3/067 | (2006.01) | |
| H01S 5/042 | (2006.01) | |
| B23K 26/36 | (2014.01) | |
| B23K 26/40 | (2014.01) | |
| B23K 26/073 | (2006.01) | |
| B23K 26/00 | (2014.01) | |
| H01L 27/142 | (2014.01) | |
| H01S 3/23 | (2006.01) | |
| H01S 3/16 | (2006.01) | |

(52) U.S. Cl.
CPC .............. *H01S 5/0427* (2013.01); *B23K 26/365* (2013.01); *H01S 3/06754* (2013.01); *B23K 26/4005* (2013.01); *H01S 3/2308* (2013.01); *B23K 26/0732* (2013.01); *Y02E 10/50* (2013.01); *H01S 2301/20* (2013.01); *B23K 26/409* (2013.01); *B23K 26/0063* (2013.01); *H01S 3/1618* (2013.01); *H01L 27/1425* (2013.01)
USPC ............... 372/6; 372/25; 372/70; 372/75

(58) Field of Classification Search
USPC ............................................. 372/6
See application file for complete search history.

(56) References Cited

U.S. PATENT DOCUMENTS

| 4,190,759 A | * | 2/1980 | Hongo et al. | ............ 219/121.68 |
| 5,710,786 A | * | 1/1998 | Mackechnie et al. | ............. 372/6 |

(Continued)

FOREIGN PATENT DOCUMENTS

| JP | 2002-033495 | 1/2002 |
| JP | 2002-273582 | 9/2002 |

(Continued)

OTHER PUBLICATIONS

Heise et al. "Laser ablation of thin molybdenum films on transparent substrates at low fluences", Appl Phys (A) (2011) (102), pp. 173-178, Aug. 24, 2010.*

(Continued)

*Primary Examiner* — Xinning Niu
(74) *Attorney, Agent, or Firm* — Venable LLP; Michael A. Sartori; Tamatane J. Aga

(57) ABSTRACT

The present invention relates to a method of processing a metal thin film formed on a transparent substrate by radiating pulsed light onto the metal thin film, and having the steps of repeatedly outputting the pulsed light by directly modulating a semiconductor laser of the seed light source in accordance with electric signals, amplifying the pulsed light using an optical amplifier including an optical amplification medium, controlling the full width at half maximum of the pulsed light that is amplified and outputted by the optical amplifier to be 0.5 ns or less, and removing the metal thin film by radiating the pulsed light thus having the controlled full width at half maximum onto the metal thin film through the transparent substrate.

12 Claims, 12 Drawing Sheets

(56) References Cited

U.S. PATENT DOCUMENTS

| | | |
|---|---|---|
| 2003/0152756 A1 | 8/2003 | Yamada et al. |
| 2009/0141751 A1* | 6/2009 | Kakui .............................. 372/25 |
| 2010/0183040 A1* | 7/2010 | Ishizu et al. .................... 372/25 |
| 2010/0278503 A1* | 11/2010 | Nakai et al. ................... 385/142 |

FOREIGN PATENT DOCUMENTS

| | | |
|---|---|---|
| JP | 2003-181678 | 7/2003 |
| JP | 2007-158012 | 6/2007 |
| JP | 2009-119521 | 6/2009 |
| JP | 2009-172629 | 8/2009 |
| JP | 2010-087041 | 4/2010 |
| JP | 2010-125489 | 6/2010 |
| JP | 2010-171131 | 8/2010 |
| WO | WO-2009/087728 A1 | 7/2009 |

OTHER PUBLICATIONS

Bovatsek et al. "Thin film removal mechanisms in ns-laser processing of photovoltaic materials", Thin Solid Films (2010) 2897-2904, Oct. 29, 2009.*

Huber et al. "High Speed Structuring of CIS Thin-Film Solar Cells With Picosecond Laser Ablation," Proc. of SPIE, vol. 7203, pp. 72030R-1-72030R-9 (2009).

Gerke et al., "Pulsewidth Dependence of Laser Scribed Molybdenum for Monolithically Integrated Thin Film Photovoltaic Device," Lasers, Sources, and Related Photonic Devices Technical Digest, 2012 OSA, pp. 1-3.

International Preliminary Report on Patentability issued in International Application No. PCT/JP2011/070640 dated Apr. 18, 2013.

Office Action in Chinese Patent Application No. 201180044627.1, dated Jul. 3, 2014.

* cited by examiner

LASER PROCESSING METHOD

CROSS-REFERENCE TO RELATED APPLICATION

This application claims the priority to Provisional Application No. 61/385,373 by the same applicant, filed on Sep. 22, 2010, the disclosure of which is hereby incorporated by reference in its entirety.

BACKGROUND OF THE INVENTION

1. Field of the Invention

The present invention relates to a laser processing method.

2. Related Background Art

A pulsed laser beam is radiated onto a work piece to process the work piece. A laser processing technique described in Heinz P. Huber, et al., "High speed structuring of CIS thin-film solar cells with picosecond laser ablation," Proc. of SPIE, Vol. 7203, (2009) (Non-Patent Document 1) radiates pulsed light with pulse width of approximately picoseconds onto a CIS (Copper-Indium-Diselenide, $CuInSe_2$) thin film, which is formed on a transparent glass plate, to process the thin film (ablation). In the laser processing technique described in Non-Patent Document 1, a model "picoREGEN IC-1064-1500" manufactured by High Q Laser Inc. is used as a pulsed laser light source. This pulsed laser light source employs a mode lock structure, has a regenerative amplifier, and outputs pulsed light with pulse width of approximately picoseconds.

SUMMARY OF THE INVENTION

The present inventors have examined the above prior art, and as a result, have discovered the following problems.

Namely, a mode-lock pulsed laser light source, which includes a regenerative amplifier and outputs pulsed light with pulse width of approximately picoseconds, is generally expensive. In such a pulsed laser light source, the freedom of setting the repetition frequency of a pulsed light output is restricted due to the structure of a laser resonator. In the pulsed laser light source manufactured by High Q Laser Inc., the repetition frequency of a pulsed light output is increased up to only 30 kHz. The lower the repetition frequency of a pulsed light output is, the lower the lower the throughput of processing.

The present invention has been developed to eliminate the problems described above. It is an object of the present invention to provide a method that is capable of performing high-throughput processing by using an inexpensive, non-mode-lock (nonresonant structure) pulsed laser light source.

A laser processing method according to the present invention is a laser processing method of processing a metal thin film formed on a transparent substrate by a pulsed light radiation. The laser processing method has the steps of preparing a semiconductor laser, preparing a fiber laser comprising, at least, an optical amplifier and a MOPA structure (referred to as "MOPA fiber laser" hereinafter), controlling a full width at half maximum ("FWHM" hereinbelow) of amplified pulsed light in a desired range, and then radiating pulsed light from the MOPA fiber laser onto the metal thin film through the transparent substrate. The semiconductor laser to be prepared repeatedly outputs the pulsed light by being directly modulated in accordance with electric signals. The MOPA fiber laser to be prepared has at least the optical amplifier. The optical amplifier includes glass doped with rare earth element-added as an optical amplification medium and amplifies the pulsed light that is outputted from the semiconductor laser. In the MOPA fiber laser, the pulsed light that is outputted from the optical amplifier is controlled such that the FWHM thereof becomes 0.2 ns or more but less than 1 ns. The pulsed light with the controlled FWHM is radiated from the MOPA fiber laser onto the metal thin film from the opposite side of the metal thin film with respect to the transparent substrate, whereby the metal thin film is removed.

The laser processing method according to the present invention uses a pulsed laser light source having a simple and inexpensive MOPA structure. The FWHM of the amplified pulsed light that is outputted from the optical amplifier is controlled to be 0.2 ns or more. In this case, damage to the transparent substrate can be provided. On the other hand, the FWHM of the amplified pulsed light that is outputted from the optical amplifier is controlled to be less than 1 ns, or preferably 0.5 ns or lower. The metal thin film can be removed with high throughput by radiating the pulsed light from the transparent substrate side onto the metal thin film.

In the laser processing method according to the present invention, the repetition frequency of an output of the pulsed light preferably exceeds 100 kHz. In this case, the throughput can be enhanced.

In the laser processing method according to the present invention, when performing a pulse scan in which a pulsed light radiation position is scanned on the metal thin film, based on a preset scanning speed and a preset repetition frequency for the pulsed light radiation, it is preferred that an overlap ratio of spots irradiated with the pulsed light be 60% or less, and that a laser output have predetermined average power and peak power for removing the metal thin film. In this case, the processing quality can be improved. Note that, when using an optical fiber that includes a core having a rectangular cross section, the overlap ratio may be set at 50% or lower.

In the laser processing method according to the present invention, a spectrum of the amplified pulsed light that is outputted from the optical amplifier has a peak at a peak wavelength of a spectrum of the pulsed light that is outputted from the semiconductor laser, and has a peak also at a wavelength different from that peak wavelength. It is preferred that the pulsed light be radiated onto the metal thin film after a beam profile of the amplified pulsed light that is outputted from the optical amplifier is uniformized by beam profile uniformizing means. Here, for example, an optical fiber that includes a core having a rectangular cross section is preferably used as the beam profile uniformizing means. In addition, a fluence of the pulsed light is preferably 4 $J/cm^2$ or more, on an irradiated surface of the transparent substrate.

DESCRIPTION OF THE PREFERRED EMBODIMENTS

Figure 1:
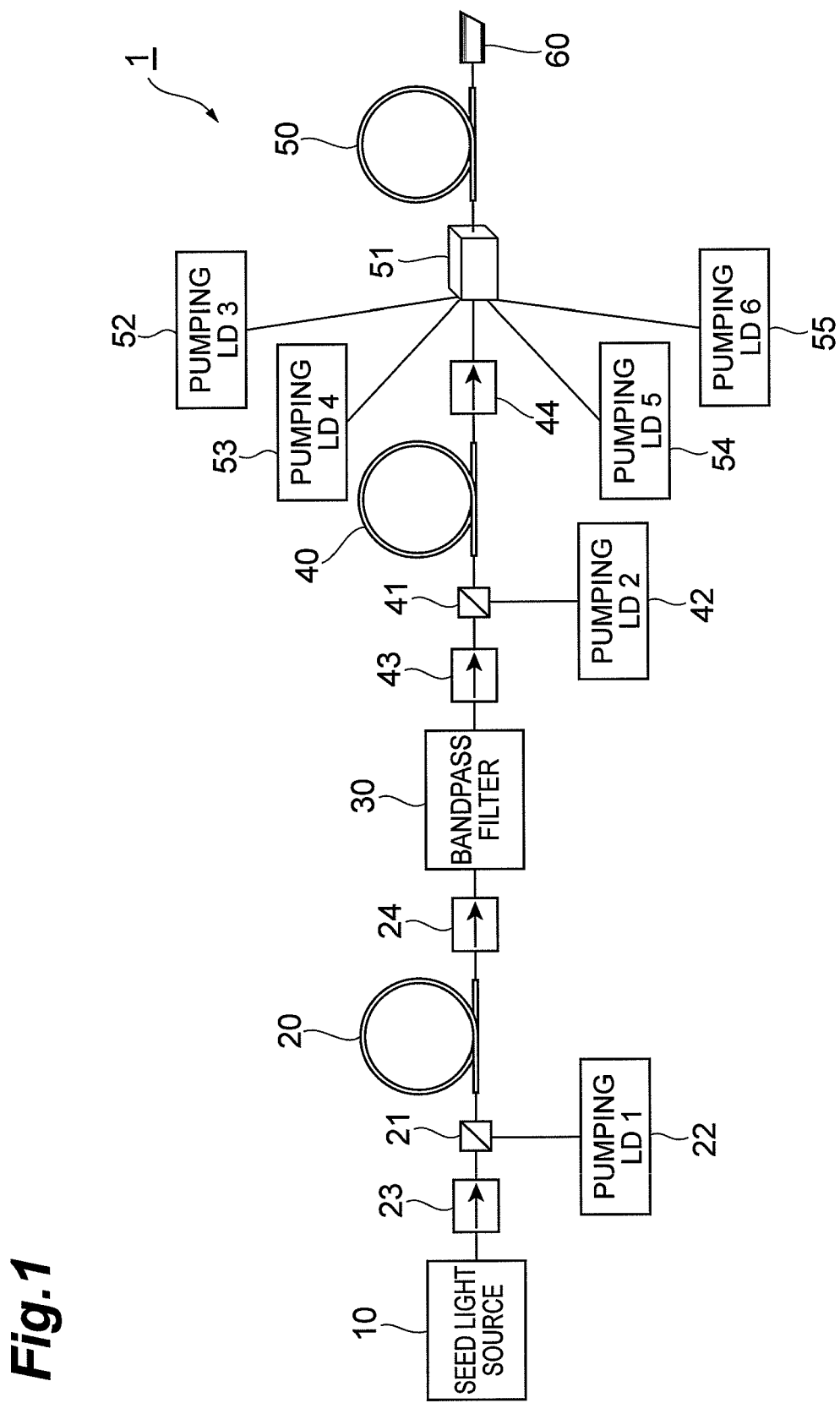
FIG. 1 is a configuration diagram of a pulsed laser light source 1.

In the following, embodiments of the present invention will be described hereinafter in detail with reference to FIGS. 1 to 5, 6A to 6C, 7 to 9, and 10A to 12B. In the description of the drawings, identical or corresponding components are designated by the same reference numerals, and overlapping description is omitted.

First of all, an example of a configuration of a pulsed laser light source that is used favorably in a laser processing method according to the present embodiment will be described. FIG. 1 is a configuration example of a pulsed laser light source 1. The pulsed laser light source 1 shown in this diagram has a seed light source 10, a YbDF (Yb-Doped Fiber) 20, a bandpass filter 30, a YbDF 40, a YbDF 50 and the like, and has a MOPA (Master Oscillator Power Amplifier) structure. The pulsed laser light source 1 is of a non-mode lock state (nonresonant structure) and outputs pulsed light having a wavelength of approximately 1060 nm, which is suitable in laser processing.

The seed light source 10 includes a semiconductor laser that is directly modulated in accordance with electric signals to repeatedly output pulsed light. The semiconductor laser is preferably of Fabry-Perot type in terms of providing high power and avoiding a nonlinear effect such as induced Brillouin scattering (SBS). Furthermore, the semiconductor laser outputs pulsed light having a wavelength of approximately 1060 nm, which can provide benefits to the YbDFs 20, 40, 50, the amplifying optical fibers. The YbDFs 20, 40, 50 are optical amplification media, which are obtained by adding a Yb element (rare-earth element), serving as an active substance, to a core of an optical fiber mainly composed of silica glass. The YbDFs 20, 40, 50 each have a pumping light wavelength and an amplified light wavelength proximal to each other, and are advantageous in terms of providing power conversion efficiency and gaining benefits in the vicinity of the wavelength 1060 nm. These YbDFs 20, 40, 50 configure a three-stage optical fiber amplifier (constituting at least part of the MOPA fiber laser).

Pumping light that is outputted from a pumping light source 22 and passes through an optical coupler 21 is supplied in a forward direction to the first-stage YbDF 20. Then, the YbDF 20 inputs pulsed light that is outputted from the seed light source 10 and passes through an optical isolator 23 and the optical coupler 21, amplifies the pulsed light, and outputs the pulsed light through an optical isolator 24.

The bandpass filter 30 inputs the pulsed light that is outputted from the seed light source 10 and amplified by the first-stage YbDF 20, attenuates either a light spectrum on the short wavelength side from a peak wavelength of the pulsed light or a light spectrum on the long wavelength side of the same more than the other in a wavelength band of the input pulsed light, and then outputs the resultant light. A high-pass filter or a low-pass filter may be used in place of the bandpass filter, but the high-pass filter acts only on the long wavelength side of a seed light source spectrum, whereas the low-pass filter acts only on the short wavelength side of the seed light source spectrum. The bandpass filter, however, has the functions of both the high-pass filter and the low-pass filter.

Pumping light, which is outputted from a pumping light source 42 and passes through an optical coupler 41, is supplied in the forward direction to the second-stage YbDF 40. Then, the YbDF 40 inputs pulsed light that is outputted from the bandpass filter 30 and passes through an optical isolator 43 and the optical coupler 41, amplifies the pulsed light, and outputs the pulsed light through an optical isolator 44. Pumping light, which is outputted from each of pumping light sources 52 to 55 and passes through a combiner 51, is supplied in the forward direction to the third-stage YbDF 50. Then, the YbDF 50 inputs and further amplifies the pulsed light amplified by the second-stage YbDF 40, and then outputs the pulsed light to the outside through an end cap 60.

The following describes favorable configuration examples. Pumping light having a pumping wavelength of 975 nm and a constant power of 200 mW is injected in a forward direction to the first-stage YbDF 20 by a core pumping method. The YbDF 20 to be used has a length of 5 m, and an unsaturated absorption coefficient of 240 dB/m at a wavelength of 975 nm. A core diameter of the YbDF 20 is 6 µm and NA thereof is approximately 0.12. Pumping light having a pumping wavelength of 975 nm and a constant power of 200 mW is injected in the forward direction to the second-stage YbDF 40 by the core pumping method. The YbDF 40 to be used has a length of 7 m and an unsaturated absorption coefficient of 240 dB/m at a wavelength of 975 nm. A core diameter of the YbDF 40 is 6 µm and NA thereof is approximately 0.12. Pumping light having a pumping wavelength of 975 nm and a power of 20 W (four pumping LDs of 5 W level) is injected in the forward direction to the third-stage YbDF 50 by a cladding pumping method. The YbDF 50 to be used has a length of 5 m and an unsaturated absorption coefficient of 1200 dB/m at a core part. A core diameter of the YbDF 50 is 10 µm and NA thereof is approximately 0.06. A cladding within the YbDF 50 has a diameter of 125 µm and NA of approximately 0.46.

Such a pulsed laser light source 1 with a MOPA structure is inexpensive due to its simple structure, and a repetition frequency of a pulsed light output can be set arbitrarily. Particularly, the pulsed laser light source 1 uses the bandpass filter 30 to attenuate either the light spectrum on the short wavelength side from the peak wavelength of the pulsed light or the light spectrum on the long wavelength side of the same more than the other, and then outputs the resultant light, the pulsed light being outputted from the seed light source 10 and amplified by the first-stage YbDF 20. Therefore, the pulsed light having its pulse width compressed into 1 ns or lower, can be outputted.

Figure 2:
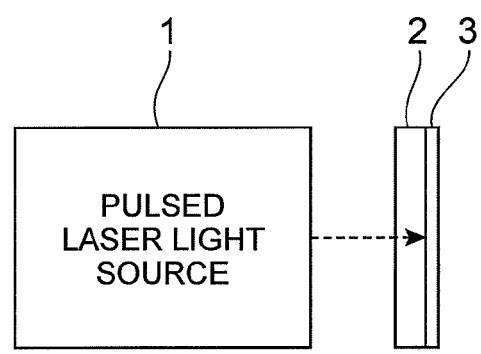
FIG. 2 is a diagram for explaining a laser processing method in which the pulsed laser light source 1 is used.

Moreover, the laser processing method according to the present embodiment uses the pulsed laser light source 1 having the MOPA structure, and radiates pulsed light onto a metal thin film 3 on a transparent substrate 2 to process the metal thin film 3, as shown in FIG. 2. In so doing, the FWHM of each of pulsed light beams that are outputted from the pulsed laser light source 1 is controlled to be 0.5 ns or lower. Such pulsed light beams are radiated onto the metal thin film 3 from the transparent substrate 2 side, thereby removing the metal thin film 3. It is preferred that the FWHM of each of the pulsed light beams that are outputted from the pulsed laser light source 1 be 0.2 ns or more. It is preferred that the repetition frequency of a pulsed light output exceed 100 kHz. In addition, when performing a pulse scan in which a pulsed light radiation position is scanned on the metal thin film 3, based on a preset scanning speed and a preset repetition frequency for the pulsed light radiation, an overlap ratio of spots irradiated with the pulsed light is 60% or less, and a laser output has predetermined average power and peak power for removing the metal thin film.

Figure 3:
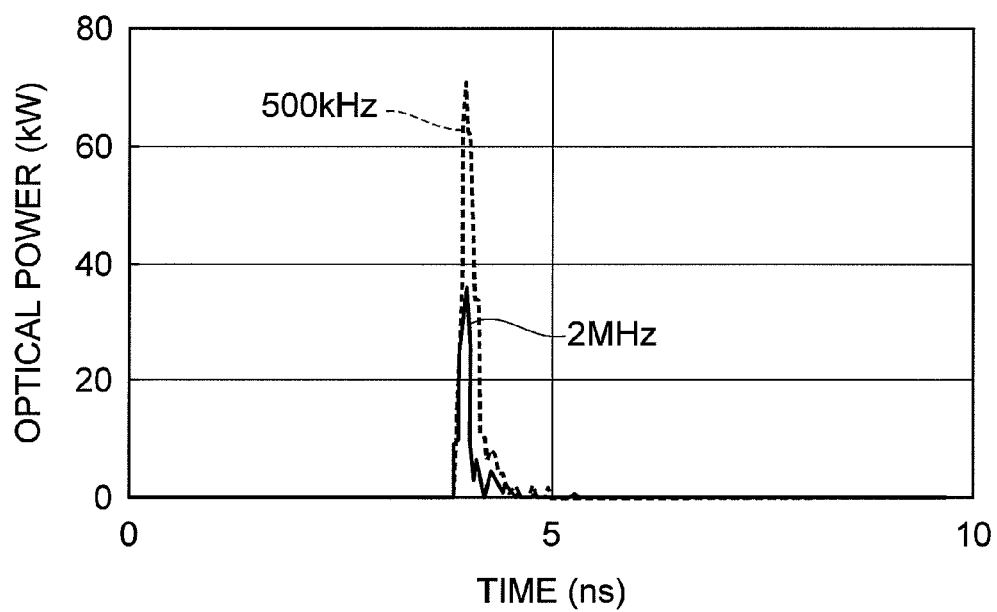
FIG. 3 is a diagram showing an example of a waveform of pulsed light that is outputted from the pulsed laser light source 1.

FIG. 3 is a diagram showing an example of a waveform of the pulsed light that is outputted from the pulsed laser light source 1. This diagram shows a pulsed light waveform in which the repetition frequencies of a pulsed light output are 500 kHz and 2 MHz. In either case, the FWHM of the pulsed light can be reduced to 200 ps or lower.

Figure 4:
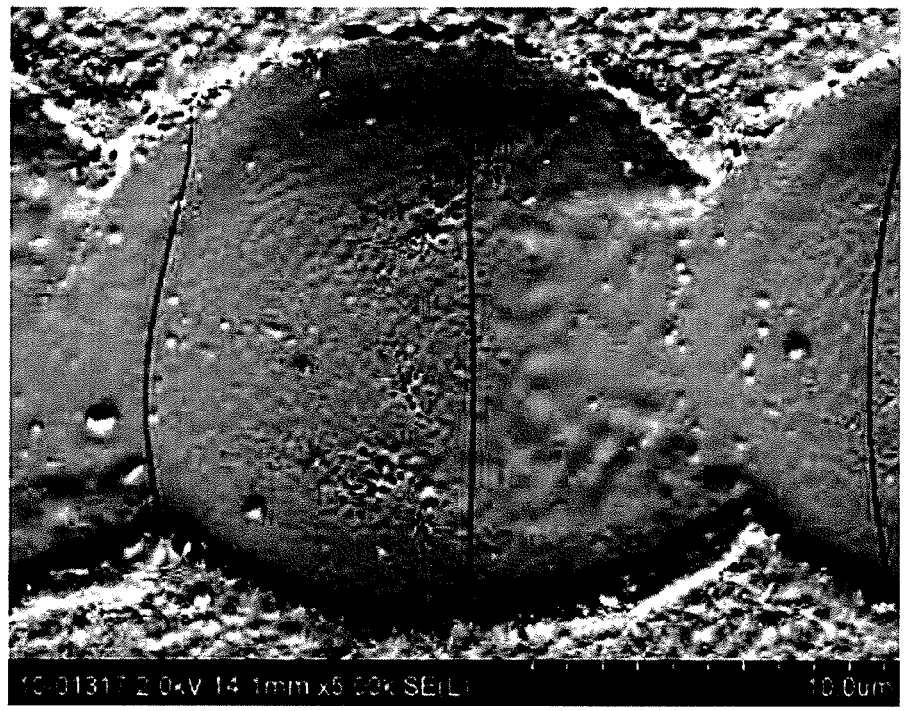
FIG. 4 is a SEM picture captured when a TCO film on a transparent glass plate is removed.

However, when a TCO (Transparent Conductive Oxide) film on a transparent glass plate was removed by radiating thereon the pulsed light having the pulse waveform shown in FIG. 3, microscopic cracks were generated on the transparent glass plate, as shown in FIG. 4. FIG. 4 is a SEM picture obtained when the TCO film on the transparent glass plate was removed. The processing conditions here are as follows: the FWHM of the pulsed light is 200 ps; the repetition frequency of the pulsed light output is 150 kHz; the average power for pulsed light radiation is 6.8 W; and the scanning speed is 2000 mm/s. The fluence of the pulsed light here was 3.1 J/cm$^2$.

Figure 5:
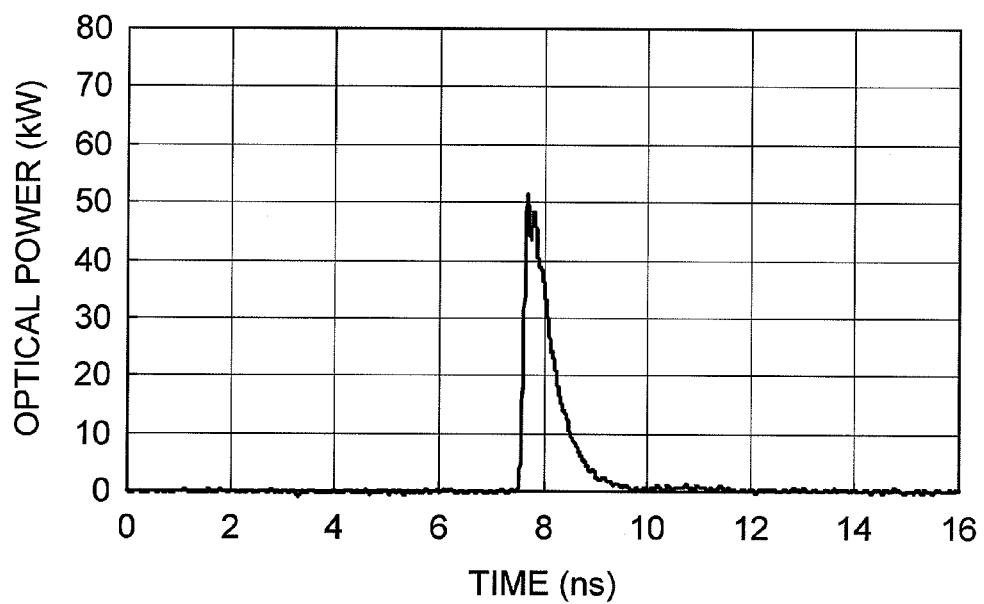
FIG. 5 is a diagram showing another example of a waveform of pulsed light that is outputted from the pulsed laser light source 1.

As shown in FIG. 5, pulsed light that has an increased pulse width and a lowered pulse peak value was used. The FWHM of the pulsed light was 0.5 ns, and the repetition frequency of the pulsed light output was 250 kHz. A Mo film (melting point is 2620° C.) on a transparent glass plate was removed by radiating thereon the pulsed light that has a pulse waveform shown in FIG. 5. The average power for the pulsed light radiation was 5.7 W and the scanning speed was 5000 mm/s. The pulsed light was radiated onto the Mo film from the transparent glass plate side. The Mo film is formed on the transparent glass plate by means of a sputtering or CVD method, and is used in a CIS-type solar battery.

Figure 6A:
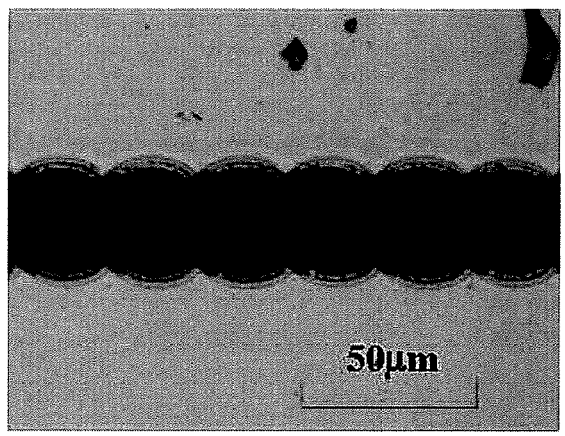
FIG. 6A is a diagram showing a micrograph captured when a Mo film on a transparent glass plate is removed, FIG. 6B a diagram showing a SEM picture thereof, and FIG. 6C a diagram showing EDX analysis results thereof.
Figure 6B:
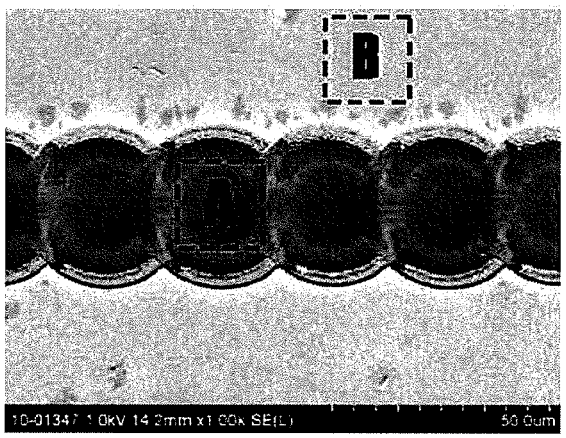
Figure 6C:
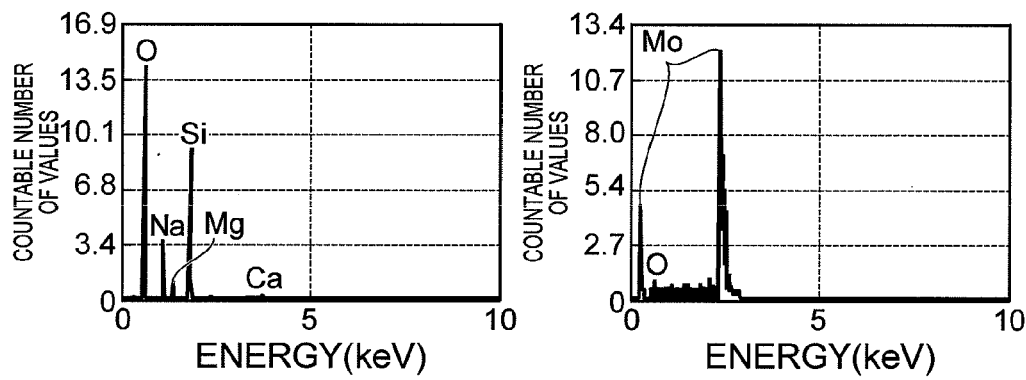

Removal of the Mo film by radiating the pulsed light thereon as described above was done successfully without causing any defects such as microscopic cracks, peeling, and rolling up between spots, as shown in FIG. 6. FIGS. 6A, 6B and 6C are, respectively, a micrograph, a SEM picture, and EDX analysis results, which were obtained when the Mo film on the transparent glass plate was removed. The processing quality is equivalent to the processing quality obtained as a result of the process performed by radiating pulsed light having a pulse width of 10 ps as described in Non-Patent Document 1. While the scanning speed in Non-Patent Document 1 was 240 mm/s, the present embodiment achieved a scanning speed of 5000 mm/s, at least 20 times higher than that of Non-Patent Document 1. The fluence of the pulsed light was 4.5 J/cm$^2$. A residue of Mo was observed when the fluence was lower than 4.5 J/cm$^2$. It is considered that the reason why the above-described processing was possible with the pulse width greater than 10 ps described in Non-Patent Document 1, is because of the setting of the fluence. The relationship between the fluence, the pulse width and a work piece depends on a case-by-case basis, but the present embodiment illustrates the fact that the processing is possible even with an inconceivable pulse width.

Figure 7:
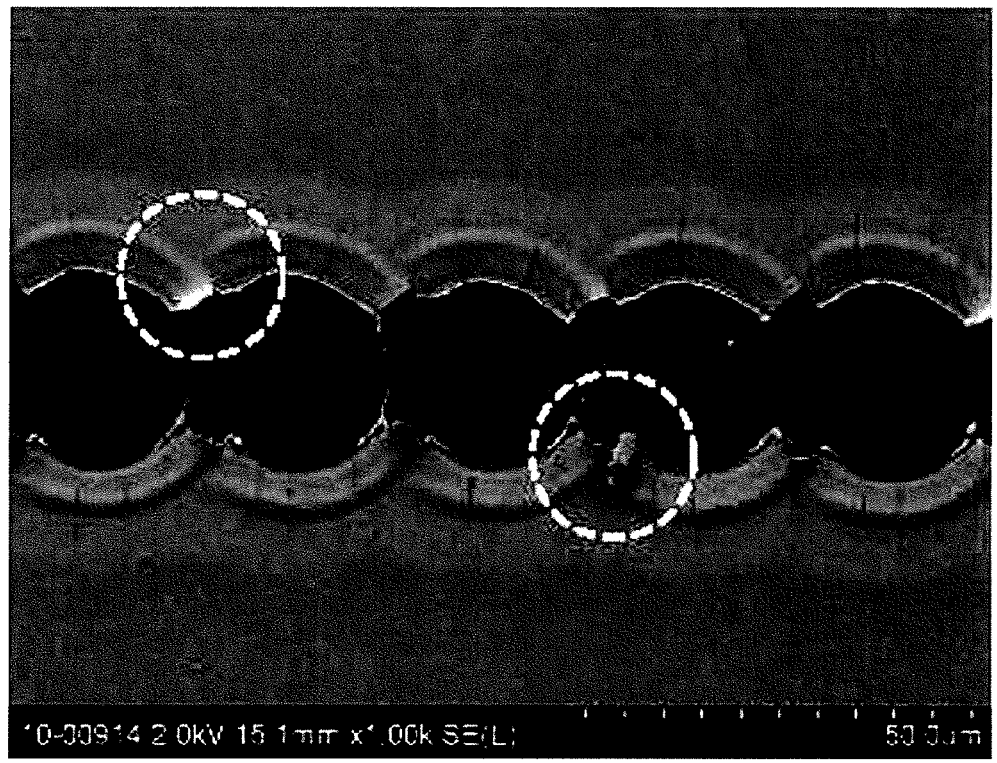
FIG. 7 is a SEM picture captured when the Mo film on the transparent glass plate is removed.

Note that rolling up between spots is a defect where the Mo film rolls up between two adjacent pulsed light radiation spots, as shown in the dashed circles in the SEM picture shown in FIG. 7. The processing conditions in this diagram are as follows: the FWHM of the pulsed light is set at 10 to 20 ns; the repetition frequency of a pulsed light output is 250 kHz; the average power for pulsed light radiation is 8 W; and the scanning speed is 5000 mm/s.

Furthermore, the pulsed laser light source 1 with the configuration described above has the MOPA structure that has a semiconductor laser as the seed light source 10, the semiconductor laser having a several hundred mA drive current (over 200 mA) directly modulated. Pulsed light having a subnanosecond pulse width is outputted from the pulsed laser light source 1 in order to perform the processing. For this reason, the following advantages are obtained. In other words, the pulsed laser light source 1 uses the bandpass filter 30 to attenuate either the light spectrum on the short wavelength side from the peak wavelength of the pulsed light or the light spectrum on the long wavelength side of the same more than the other, and then outputs the resultant light, the pulsed light being outputted from the seed light source 10 and amplified by the first-stage YbDF 20. Therefore, the pulsed light having its pulse width compressed into subnanoseconds, can be outputted.

Figure 8:
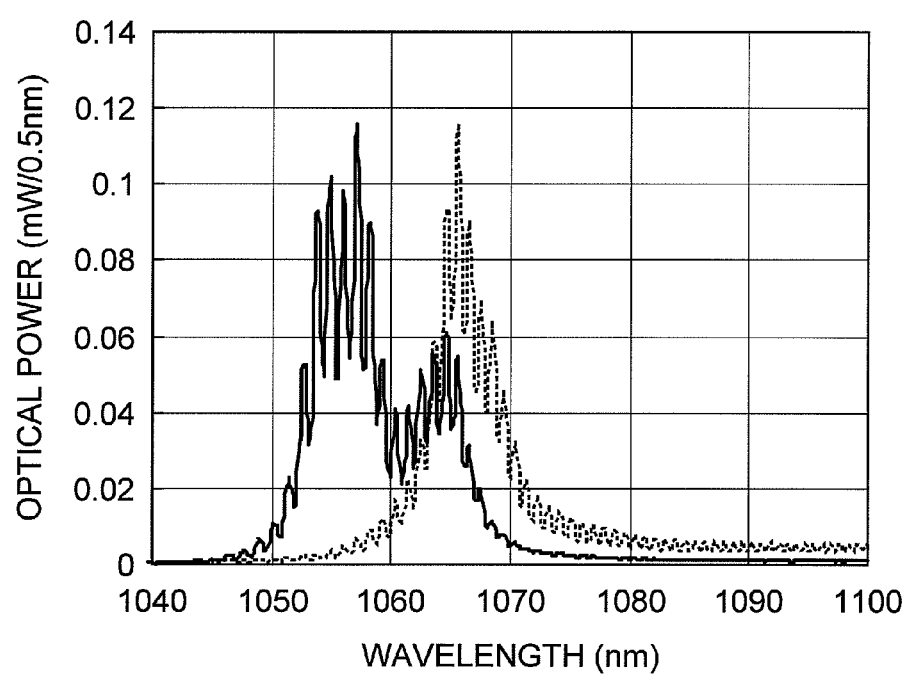
FIG. 8 is a diagram showing spectra of pulsed light outputted from the pulsed laser light source 1.

As a result, a chirping component of the seed light source 10 is obtained from the pulsed laser light source 1 of FIG. 1 by the BPF, as shown by the solid line in FIG. 8, whereby the spectrum of the pulsed light having its pulse width compressed into subnanoseconds has a sub-peak, not only at a peak wavelength of the spectrum of the pulsed light that is outputted from the semiconductor laser functioning as the seed light source 10, but also at a wavelength different than this peak wavelength, and the FWHM of the entire spectrum having the peak and the sub-peak becomes 10 nm or above. The value of the sub-peak is approximately half the value of the peak. Note that the spectrum shown by the dashed line in the same diagram is a spectrum of pulsed light that is processed as shown in the SEM picture of FIG. 7, and the BPF is set such that the amount of seed light source output to be transmitted becomes maximum without obtaining the chirping component shown by the solid line.

Figure 9:
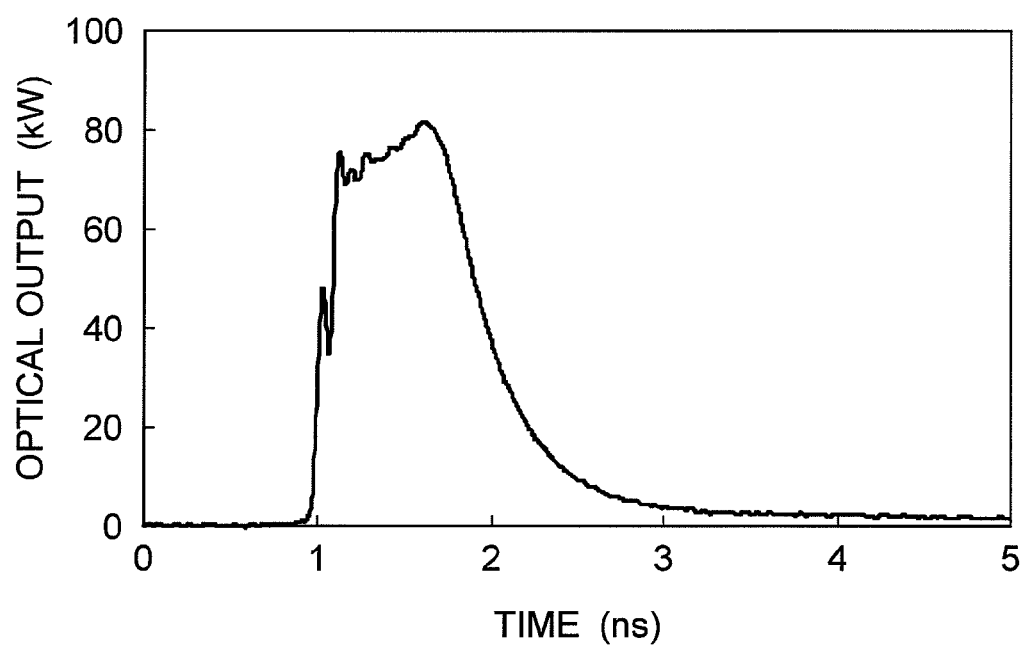
FIG. 9 is a diagram showing a pulse waveform from another light source of the pulsed laser light source 1.
Figure 10A:
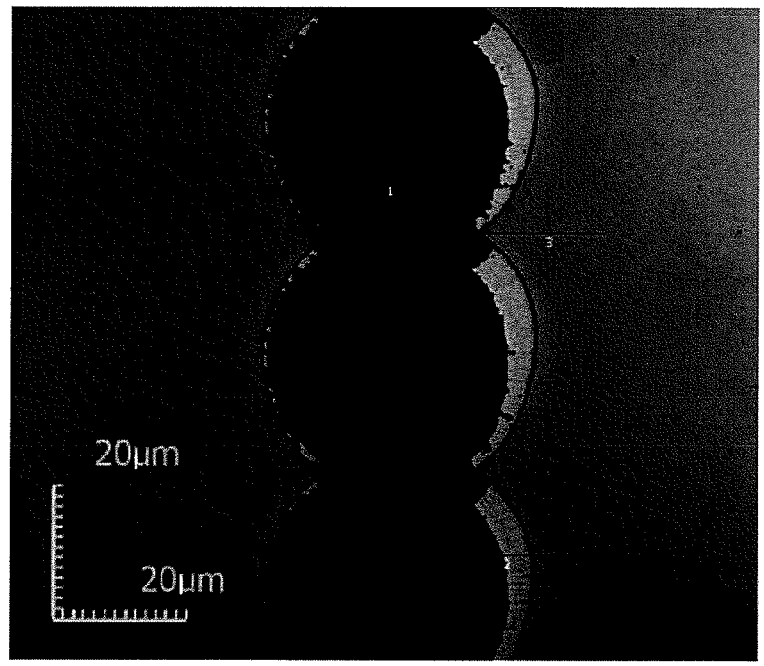
FIG. 10A is a SEM picture that is captured when a Mo film on a transparent glass plate is removed with a pulse having FWHM of 0.96 ns shown in FIG. 9, and FIG. 10B a diagram showing a three-dimensional image thereof.
Figure 10B:
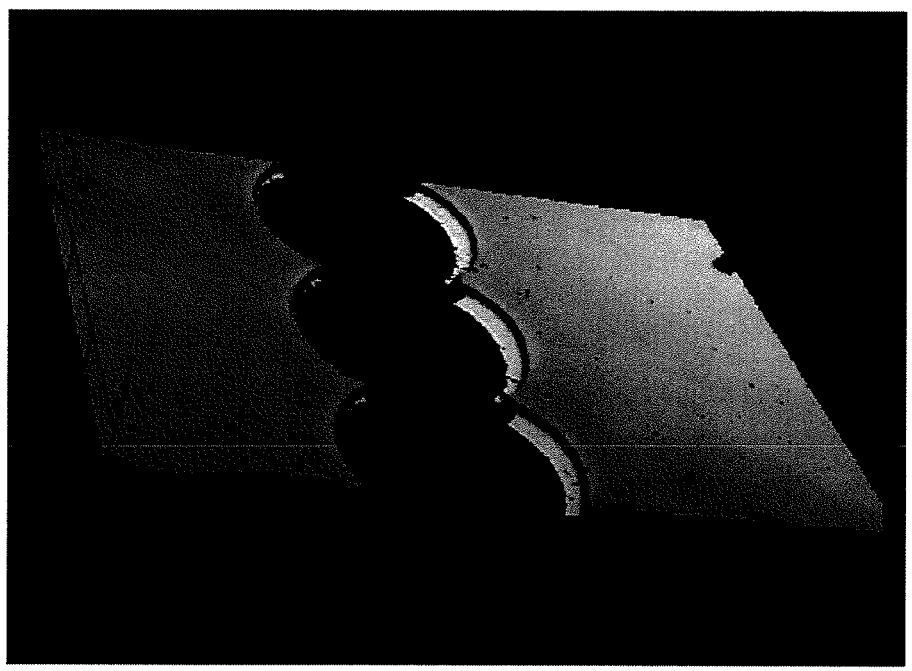

FIG. 9 shows a spectrum waveform (light output and time) from a pulsed laser light source (having the same structure as the one shown in FIG. 1) different than the pulsed laser light source used in FIGS. 3 and 5. The FWHM of the pulse width is 0.96 ns. When the same processing as the one in the example shown in FIG. 6 was performed using this pulsed light, the results shown in FIGS. 10A and 10B were obtained. FIG. 10A shows a SEM picture captured when a Mo film on a transparent glass plate was removed, and FIG. 10B a diagram showing a three-dimensional image of the SEM picture captured when the Mo film on the transparent glass plate was removed. The processing quality here is equivalent to the processing quality obtained as a result of the process performed by radiating the pulsed light having a pulse width of 10 ps as described in Non-Patent Document 1. This processing achieved a scanning speed of 4000 mm/s. The repetition frequency of the pulsed light here was 150 kHz, the average power of the pulse was 8 W, and the fluence was 8.9 J/cm$^2$.

Achieving a broadband spectrum shown by the solid line in FIG. 8 is beneficial in performing beam homogenization (beam profile uniformalization) by propagating pulsed light to an optical fiber that includes a core having a rectangular cross section. This is because the beam homogenization mechanism depends on realization of a multi-traverse mode. The wider the spectrum width of pulsed light is, the more it becomes possible to prevent the occurrence of speckle caused by an interference among a plurality of traverse modes, and the generation of a dark spot can be avoided.

Figure 11A:
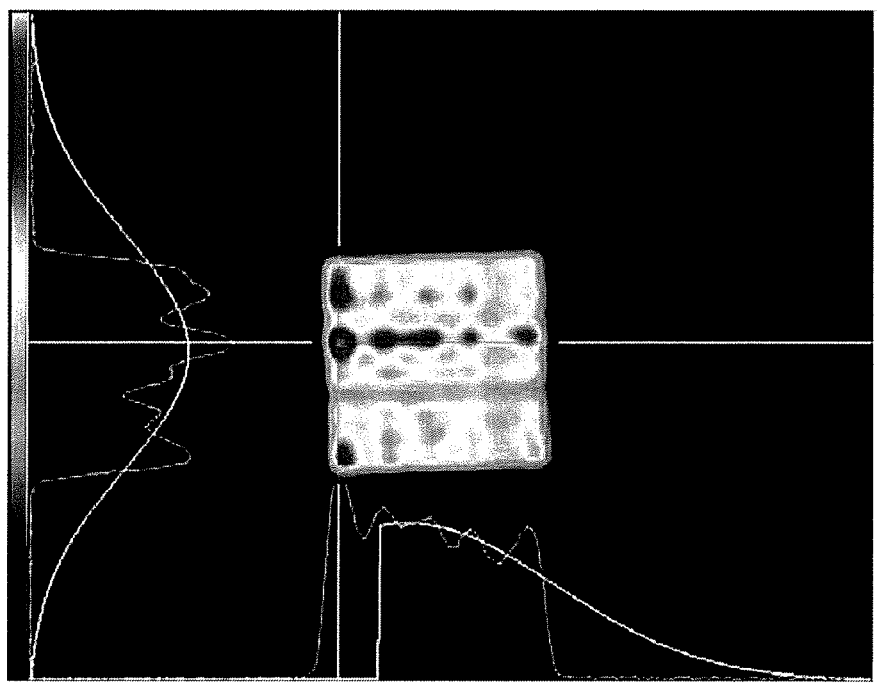
FIGS. 11A and 11B are diagrams each showing a beam profile that is obtained after pulsed light having the dashed spectrum shown in FIG. 8 propagates through a rectangular core optical fiber.
Figure 11B:
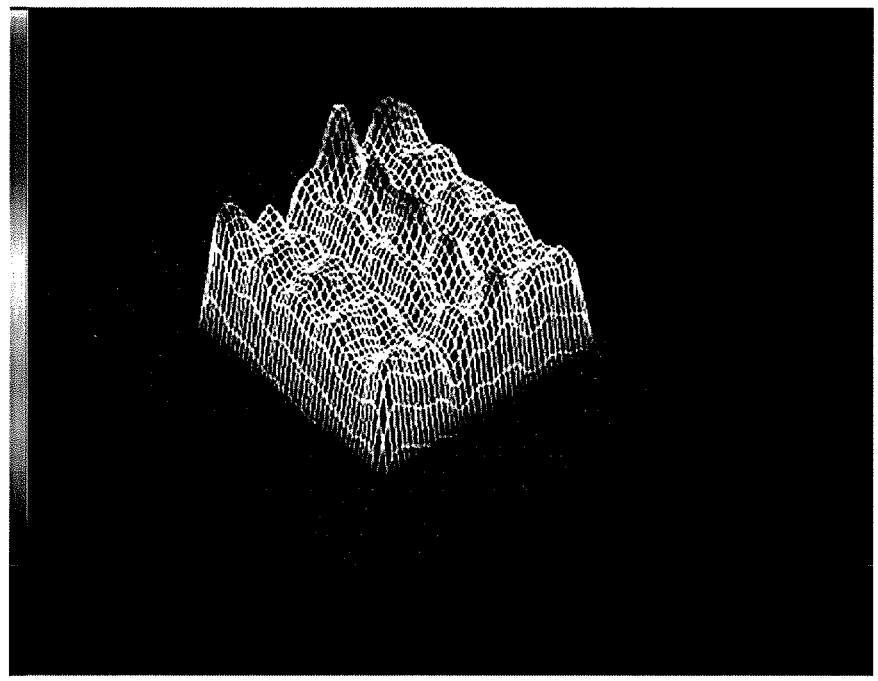
Figure 12A:
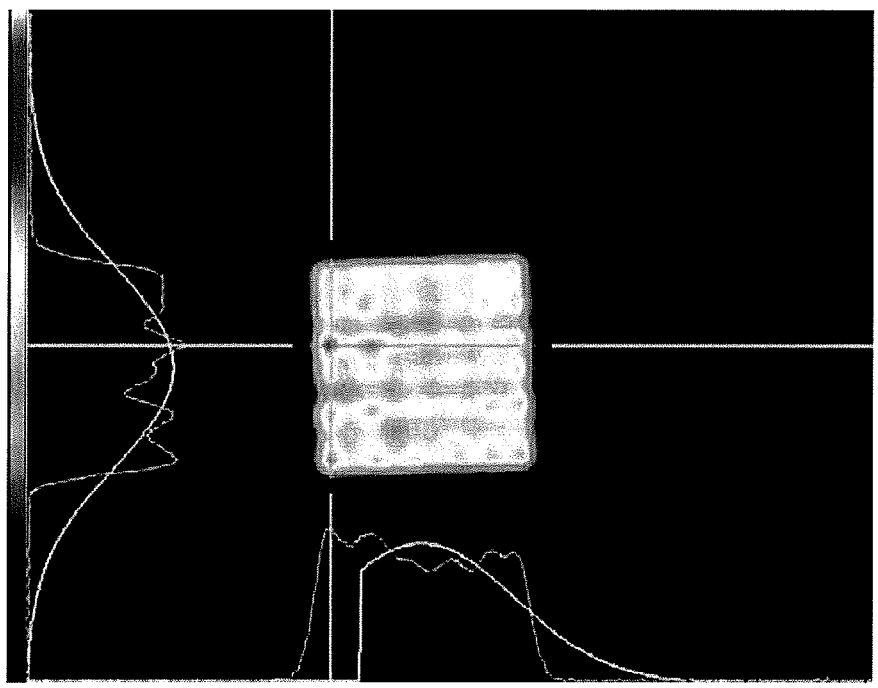
FIGS. 12A and 12B are diagrams each showing a beam profile that is obtained after pulsed light having the solid spectrum shown in FIG. 8 propagates through the rectangular core optical fiber.
Figure 12B:
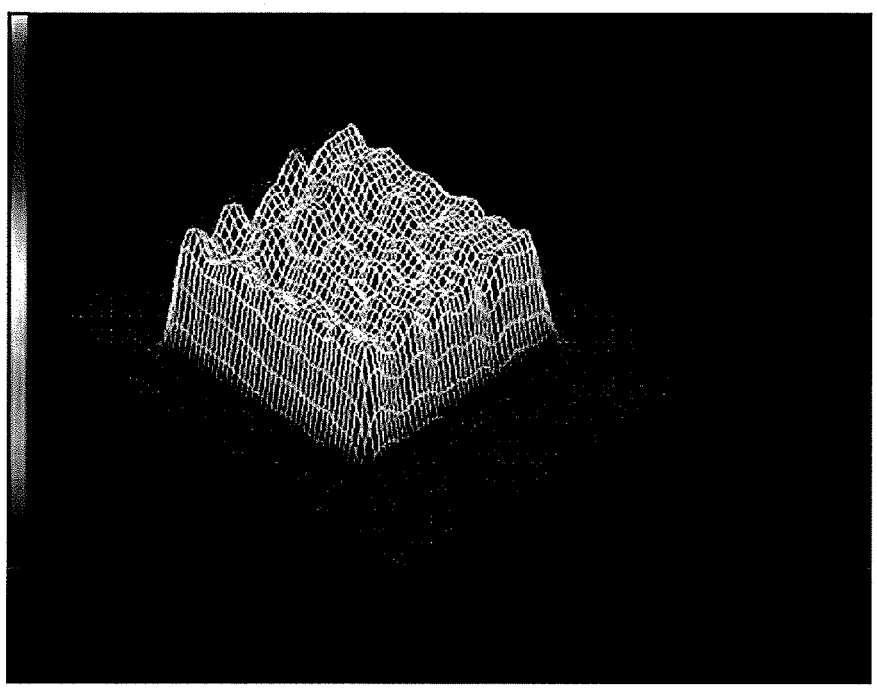

FIG. 11 is a diagram showing a beam profile obtained after the pulsed light having the dashed spectrum shown in FIG. 8 propagates through a rectangular core optical fiber. FIG. 12 is a diagram showing a beam profile obtained after pulsed light having the solid spectrum shown in FIG. 8 propagates through the rectangular core fiber. In either case, the rectangular core optical fiber has a core size of 50 μm×50 NA of 0.18, and a length of 10 m.

In the beam profile shown in FIG. 11, a V/P ratio between a minimum value (valley) and a maximum value (peak) is only 45%. In the beam profile shown in FIG. 12, on the other hand, the V/P ratio thereof was 63%. Therefore, when performing the beam homogenization using the pulsed laser light source 1 having the MOPA structure in which the directly modulated semiconductor laser functions as the seed light source, obtaining the chirping component of the seed light source 10 by means of the BPF and compressing the pulse width increases the spectrum width and therefore is beneficial in a method of laser light processing where beam homogenization is performed.

The rolling up of the Mo film between the spots shown by the dashed circles in the SEM picture of FIG. 7 causes peeling or rolling up of the Mo film. One effective solution to prevent this is to perform the beam homogenization to form the cross section of pulsed light into a rectangular shape and line up rectangular spots on a Mo film.

The examples of beam profiles shown in FIGS. 11 and 12 employ simple means for directly fusing an end surface of an output fiber of a MOPA light source (a single-mode fiber with a core diameter of 10 μm) to an end surface of the abovementioned rectangular core fiber. However, a space optical system may be provided therebetween when optically connecting the output fiber and the rectangular core fiber to each other, and realization of multi-traverse mode is further promoted and further improvement of the V/P ratio is expected, by focusing pulsed light emitted from the end surface of the output fiber by using a high-NA lens and joining it to the end surface of the rectangular core fiber. When using the rectangular core fiber, the overlap ratio may be set to be 50% or lower.

Note that the TCO (Transparent Conductive Oxide) film on the transparent glass plate shown in FIG. 4 was removed successfully with a pulse having a relatively wide pulse width with FWHM of approximately 5 ns when a repetition frequency of a pulsed light output was 160 kHz, the average power of pulsed light radiation was 10 W, and the scanning speed was 2500 mm/s. The TCO film at this time was composed of tin oxide. In other words, the fiber laser with a MOPA structure, which directly modulates a semiconductor laser using an electric signal, outputs the resultant pulsed light repeatedly, and amplifies the light using an optical amplifier that includes rare earth element-added glass as an optical amplification medium, is favorable due to its capability of outputting a row of pulses described above and removing the TCO film on the glass or metal films such as Mo on the glass.

As described above, the laser processing method of the present invention is capable of performing high-throughput processing using an expensive pulsed laser light source.

Note that the laser processing method of the present embodiment is effective not only in processing a Mo film on a transparent glass plate but also in overall processing of a relatively poorly adhesive metal film formed on a substrate made of other transparent material.

What is claimed is:

1. A laser processing method of processing a metal thin film formed on a transparent substrate by a pulsed light radiation, comprising the steps of:
   preparing a semiconductor laser that repeatedly outputs pulsed light by being directly modulated in accordance with electric signals;
   preparing a MOPA fiber laser comprising, at least, an optical amplifier that includes a glass doped with a rare earth element and amplifies the pulsed light outputted from the semiconductor laser;
   controlling a full width at half maximum of the pulsed light outputted from the optical amplifier to be 0.2 ns or longer but shorter than 1 ns; and
   removing the metal thin film by radiating the pulsed light, emitted from the MOPA fiber laser, onto the metal thin film from the opposite side of the metal thin film with respect to the transparent substrate,
   wherein the metal thin film is composed of a high-melting-point metal such as Mo.

2. The laser processing method according to claim 1, wherein the full width at half maximum of the pulsed light amplified by the optical amplifier is 0.5 ns or shorter.

3. The laser processing method according to claim 1, wherein a repetition frequency of an output of the pulsed light exceeds 100 kHz.

4. The laser processing method according to claim 1, wherein, when performing a pulsed light scan in which a pulsed light radiation position is scanned on the metal thin film, based on a preset scanning speed and a preset repetition frequency for the pulsed light radiation, an overlap ratio of spots irradiated with the pulsed light is 60%, or less and a laser output has predetermined average power and peak power for removing the metal thin film.

5. The laser processing method according to claim 1, wherein a spectrum of the pulsed light amplified by the optical amplifier has a peak at a peak wavelength of a spectrum of the pulsed light outputted from the semiconductor laser, and has a peak also at a wavelength different from that peak wavelength, and
   wherein the pulsed light amplified by the optical amplifier is radiated onto the metal thin film after a beam profile of the pulsed light is uniformized by beam profile uniformizing means.

6. The laser processing method according to claim 5, wherein the beam profile uniformizing means includes an optical fiber having a core with a rectangular cross section.

7. The laser processing method according to claim 1, wherein, on an irradiated surface of the transparent substrate, a fluence of the pulsed light is 4 J/cm$^2$ or more.

8. A laser processing method of processing a metal thin film formed on a transparent substrate by a pulsed light radiation, comprising the steps of:
   preparing a semiconductor laser that repeatedly outputs pulsed light by being directly modulated in accordance with electric signals;
   preparing a MOPA fiber laser comprising, at least, an optical amplifier that includes a glass doped with a rare earth element and amplifies the pulsed light outputted from the semiconductor laser;
   controlling a full width at half maximum of the pulsed light outputted from the optical amplifier to be 0.2 ns or longer but shorter than 1 ns; and
   removing the metal thin film by radiating the pulsed light, emitted from the MOPA fiber laser, onto the metal thin film from the opposite side of the metal thin film with respect to the transparent substrate, wherein the full width at half maximum of the pulsed light amplified by the optical amplifier is 0.5 ns or less, wherein the metal thin film is composed of a high-melting-point metal such as Mo.

9. The laser processing method according to claim 1, wherein the melting point of the metal thin film is 2620° C. or above.

10. The laser processing method according to claim 1, wherein the pulsed light outputted from the semiconductor laser has a full width at half maximum of 10 nm or above.

11. A laser processing method of processing a metal thin film formed on a transparent substrate by a pulsed light radiation, comprising the steps of:

preparing a semiconductor laser that repeatedly outputs pulsed light by being directly modulated in accordance with electric signals;

preparing a MOPA fiber laser comprising, at least, an optical amplifier that includes a glass doped with a rare earth element and amplifies the pulsed light outputted from the semiconductor laser;

controlling a full width at half maximum of the pulsed light outputted from the optical amplifier to be 0.2 ns or longer but shorter than 1 ns; and removing the metal thin film by radiating the pulsed light, emitted from the MOPA fiber laser, onto the metal thin film from the opposite side of the metal thin film with respect to the transparent substrate, wherein the metal thin film is composed of a metal having a melting point of 2620° C. or above.

12. The laser processing method according to claim 11, wherein the metal thin film is composed of Mo.

\* \* \* \* \*